United States Patent
Horch

(10) Patent No.: US 6,790,713 B1
(45) Date of Patent: Sep. 14, 2004

(54) METHOD FOR MAKING AN INLAYED THYRISTOR-BASED DEVICE

(75) Inventor: Andrew Horch, Sunnyvale, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/238,571

(22) Filed: Sep. 9, 2002

(51) Int. Cl.$^7$ ............................................. H01L 29/74
(52) U.S. Cl. ....................... 438/135; 438/133; 257/133; 257/146; 257/153; 257/175
(58) Field of Search ................................ 257/133, 146, 257/153, 175; 438/133, 135

(56) References Cited

U.S. PATENT DOCUMENTS

| | | | |
|---|---|---|---|
| 5,202,750 A | 4/1993 | Gough | |
| 5,283,201 A | 2/1994 | Tsang et al. | |
| 5,283,456 A | 2/1994 | Hsieh et al. | |
| 5,293,053 A | * 3/1994 | Malhi et al. | ................ 257/330 |
| 5,324,673 A | 6/1994 | Fitch et al. | |
| 5,338,945 A | 8/1994 | Baliga et al. | |
| 5,340,759 A | 8/1994 | Hsieh et al. | |
| 5,357,125 A | * 10/1994 | Kumagi | ..................... 257/133 |
| 5,473,176 A | 12/1995 | Kakumoto | |
| 5,612,559 A | 3/1997 | Park et al. | |
| 5,637,898 A | 6/1997 | Baliga | |
| 5,641,694 A | 6/1997 | Kenney | |
| 6,077,733 A | 6/2000 | Chen et al. | |
| 6,104,045 A | 8/2000 | Forbes et al. | |
| 6,225,165 B1 | 5/2001 | Noble, Jr. et al. | |
| 6,229,161 B1 | 5/2001 | Nemati et al. | |
| 6,462,359 B1 | 10/2002 | Nemati et al. | |
| 6,576,953 B2 | * 6/2003 | Hirler | .......................... 257/329 |
| 2001/0024841 A1 | * 9/2001 | Noble et al. | ................. 438/138 |
| 2002/0155685 A1 | * 10/2002 | Sakakibara | ................. 438/500 |

FOREIGN PATENT DOCUMENTS

WO    WO 99/63598    12/1999

OTHER PUBLICATIONS

T. Shinohe et al., Isolation Structure Optimization for High Power Reverse Conducting GTO, Apr. 1988, IEEE, PESC '88 Record, pp. 908–914.*

Digh Hisamoto, Wen–Chin Lee, Jakub Kedzierski, Hideki Takeuchi, Kazuya Asano, Charles Kuo, Erik Anderson, Tsu–Jae King, Jeffrey Bokor and Chenming Hu, FinFET–A Self–Aligned Double–Gate MOSFET Scalable to 20 nm.

Xuejue Huang, Wen–Chin Lee, Charles Kuo, Digh Hisamoto, Leland Chang, Jakub Kedzierski, Erik Anderson, Hideki Takeuchi, Yang–Kyu Choi, Kazuya Asano, Vivek Subramanian, Tsu–Jae King, Jeffrey Bokor and Chenming Hu, Sub 50–nm FinFET: PMOS.

Digh Hisamoto, Toru Kaga and Eiji Takeda, Impact of the Vertical SOI "DELTA" Structure on Planar Device Technology.

Farid Nemati and James D. Plummer, A Novel High Density, Low Voltage SRAM Cell with a Vertical NDR Device.

Farid Nemati and James D. Plummer, A Novel Thyristor–based SRAM Cell (T–RAM) for High–Speed, Low–Voltage, Giga–scale Memories.

Christopher J. Petti and James D. Plummer, The Field–Assisted Turn–Off Thyristor: A Regenerative Device with Voltage–Controlled Turn–Off.

* cited by examiner

Primary Examiner—George Eckert

(57) ABSTRACT

A semiconductor device having a thyristor is manufactured and arranged in a manner that reduces or eliminates difficulties commonly experienced in the formation and implementation of such devices. According to an example embodiment of the present invention, a thyristor (e.g., a thin capacitively-coupled thyristor) is formed having some or all of the body of the thyristor formed inlayed in a semiconductor device substrate. A trench is provided in the substrate, and a semiconductor material is formed in the trench. One or more layers of material are formed in the trench and used to form a portion of a body of the thyristor. The thyristor is formed having adjacent regions of different polarity, wherein at least one of the adjacent regions includes a portion of the semiconductor material and at least one of the adjacent regions includes a portion of the substrate. Once formed, the thyristor is coupled to one or more of a variety of types of semiconductor devices, and can implemented during conventional manufacturing processes, such as CMOS processes. In addition, this trench approach to forming the thyristor improves the ability to isolate the thyristor from other portions of the semiconductor device.

30 Claims, 10 Drawing Sheets

US 6,790,713 B1

METHOD FOR MAKING AN INLAYED THYRISTOR-BASED DEVICE

FIELD OF THE INVENTION

The present invention is directed to semiconductor devices and, more specifically, to semiconductor devices including thyristor structures and devices.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density, with typical cell size being between about 60 $F^2$ and 150 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in providing a bi-stable element for such memory cells and in overcoming many previously unresolved problems for thyristor-based memory applications. This type of NDR device has a control port that is capacitively coupled to a relatively-thin thyristor body. The thyristor body is sufficiently thin to permit modulation of the potential of the thyristor body in response to selected signals capacitively coupled via the control port. Such capacitively-coupled signals are used to enhance switching of the thyristor-based device between current-blocking and current-conducting states.

One method for manufacturing thyristor-type NDR devices (and other circuitry) is to form a vertical silicon pillar by first depositing a layer of silicon and subsequently masking and etching the deposited silicon layer. However, this approach typically makes it difficult to subsequently form planar MOSFET devices and others. For example, it is difficult to add STI (Shallow Trench Isolation) after etching the pillar since STI usually requires a chemical-mechanical polishing (CMP) step, which would be inhibited by the pillar. Patterning a mask (e.g., for photolithography) near such a pillar is also difficult because the resist has a tendency to form puddles. In addition, angled implants used after the formation of the pillar may introduce shadowing problems, with the pillar being implanted instead of the intended implantation of other devices near the pillar. Furthermore, implanting the pillar to form the thyristor, as well as masking horizontal devices such as source/drain regions of a MOSFET near the pillar, are also challenging.

These and other design considerations have presented challenges to the implementation of such a thin capacitively-coupled thyristor to bulk substrate applications, and in particular to applications where highly-dense arrays of thyristors are desirable.

SUMMARY

The present invention is directed to a thyristor-based semiconductor device that addresses the above-mentioned challenges. The present invention is exemplified in a number of implementations and applications, some of which are summarized below.

According to a more general example embodiment, the present invention is directed to a method for manufacturing a semiconductor device having a substrate and in which a trench is formed with part of the thyristor being formed in a filled portion of the trench.

In a more specific example embodiment, a method for making a semiconductor device includes forming a semiconductor material in the trench, and forming a thyristor having adjacent regions of different polarity, with at least one of the regions including a portion of the formed semiconductor material in the trench and at least one other of the regions including a portion of the substrate that is adjacent the trench. A control port is then formed so that it couples control signals capacitively to one or more of the adjacent regions.

According to another example embodiment of the present invention, a thyristor-based semiconductor device includes a trench in a substrate used to form the thyristor. A semiconductor material is formed in the trench and used to form a thyristor having adjacent regions of different polarity. One or more of the regions includes a portion of the formed semiconductor material in the trench, and one or more of the regions includes a portion of the substrate that is adjacent to the trench. A control port is formed capacitively coupled to one or more of the regions. The thyristor can then be coupled to various other circuit elements, such as a pass gate used in a memory cell. With this approach, manufacturing and operational challenges to the formation of thyristor-based devices, including those challenges discussed above, are addressed.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
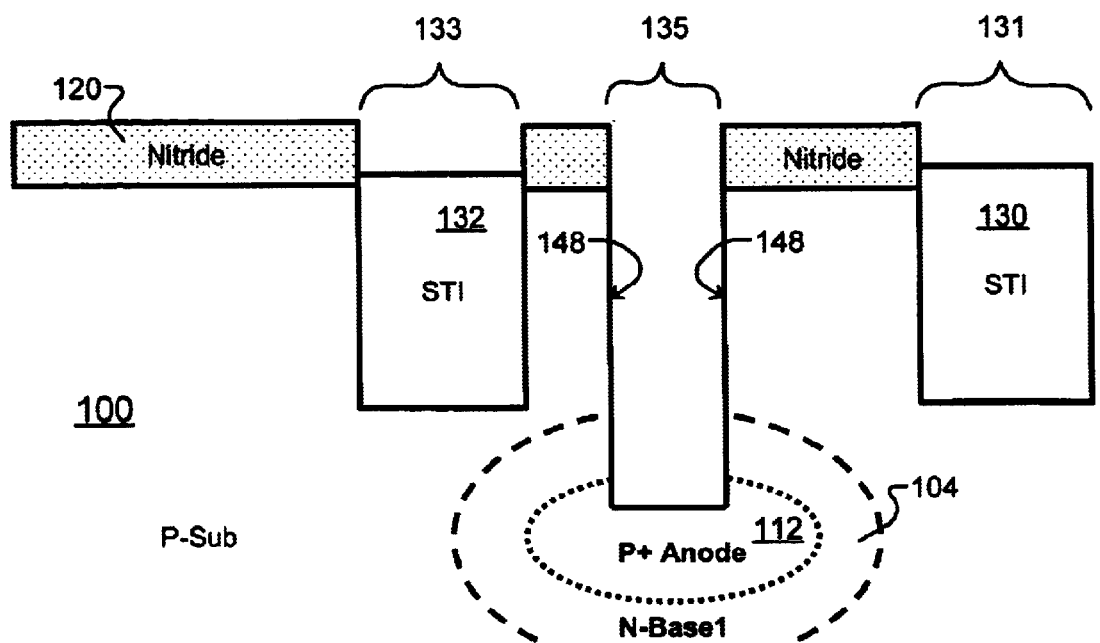
FIG. 1 is a thyristor-based semiconductor device undergoing manufacture, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for devices using thyristor-based devices, such as memory cells, and for enhancing the ability to form such devices in a semiconductor substrate. While the present invention is not necessarily limited to such applications, various aspects of the invention may be appreciated through a discussion of various examples using this context. In the examples described below in connection with the figures, various features are repeated in the figures. In the interest of brevity, these features are similarly-numbered or, in some instances, the numbers are omitted. Correspondingly, the description of certain elements has been omitted where the elements have been described in connection with previously-described figures.

According to an example embodiment of the present invention, a thyristor-based semiconductor device is manufactured having a portion of a thyristor inlayed in a substrate. A trench opening having a sidewall is formed in the substrate, a gate dielectric material is formed on the sidewall of the trench and semiconductor material that is to be used to form one or more portions of the thyristor is formed in the trench. In one implementation, the semiconductor material is implanted with a selected material and/or doped in situ during the deposition of semiconductor material to form a portion of the body of the thyristor. A thyristor control port, such as a gate, is arranged to capacitively couple a signal to a base portion of the thyristor via the gate dielectric material, and is further coupled to other circuitry in the device. This approach addresses challenges including those discussed in the background hereinabove, including the formation of a thyristor having adequate gate-to-base coupling while maintaining the ability to manufacture devices near the thyristor, which has been found to be particularly useful in memory implementations.

In one implementation, the thyristor-based semiconductor device is implemented for an NDR-based SRAM cell. This NDR-based SRAM cell can potentially provide the speed of conventional SRAM at the density of DRAM in a CMOS compatible process. The thin capacitively-coupled thyristor is used to form a bistable element for the SRAM cell. For general information regarding NDR-based memory and for specific information regarding implementations to which the present invention may be applicable, reference may be made to: "A Novel High Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, and "A Semiconductor Capacitively-Coupled NDR Device And Its Applications For High-Speed High-Density Memories And Power Switches," PCT Int'l Publication No. WO 99/63598, corresponding to U.S. Pat. No. 6,229,161, all of which are fully incorporated by reference.

The semiconductor material formed in the trench may include materials such as polysilicon, amorphous silicon, recrystallized polysilicon, recrystallized amorphous silicon, epitaxially grown silicon (selective or non-selective), and other non-silicon based materials such as SiGe and III–V semiconductor materials. In addition, the semiconductor material can be formed in the trench a variety of manners, such as by deposition or crystalline growth. Moreover, the semiconductor material may further include one or more of a plurality of impurities, such as dopants implanted therein.

In one particular implementation, the thyristor is formed as part of a memory cell having a pass device, such as an NMOSFET or a PMOSFET, which controls access to an emitter region of the thyristor. The thyristor is formed using a source/drain region of the pass device as an emitter region of the body of the thyristor. A base region is formed adjacent the source/drain region and used with the source/drain region to form a first end portion of the thyristor. The base region is doped to act with the source/drain region as either an anode or cathode end portion of the thyristor. For example, if the source/drain region is N+ doped, the base region is formed having a P dopant. A second end portion of the thyristor is formed having base and emitter regions doped differently than the first end portion to form either an anode or cathode end portion. The formation of the end portions is controlled so that one end portion of the thyristor is a cathode and the other end portion of the thyristor is an anode. A control port is arranged for capacitive coupling to one or more of the base portions and further coupled to circuitry in the device.

FIGS. 1–4 show a semiconductor device having an inlayed thyristor (e.g. a thin capacitively-coupled thyristor) at various stages of manufacture, according to another example embodiment of the present invention. Beginning with FIG. 1, Shallow Trench Isolation ("STI") regions 131 and 133 are formed. Then the deep trench 135 is formed, e.g., using a masked (photo) etch process. A portion of substrate 100 is implanted and annealed with an N dopant to forming a portion of the N well region 104, and a P+ anode 112 is implanted in the N well region.

Figure 2:
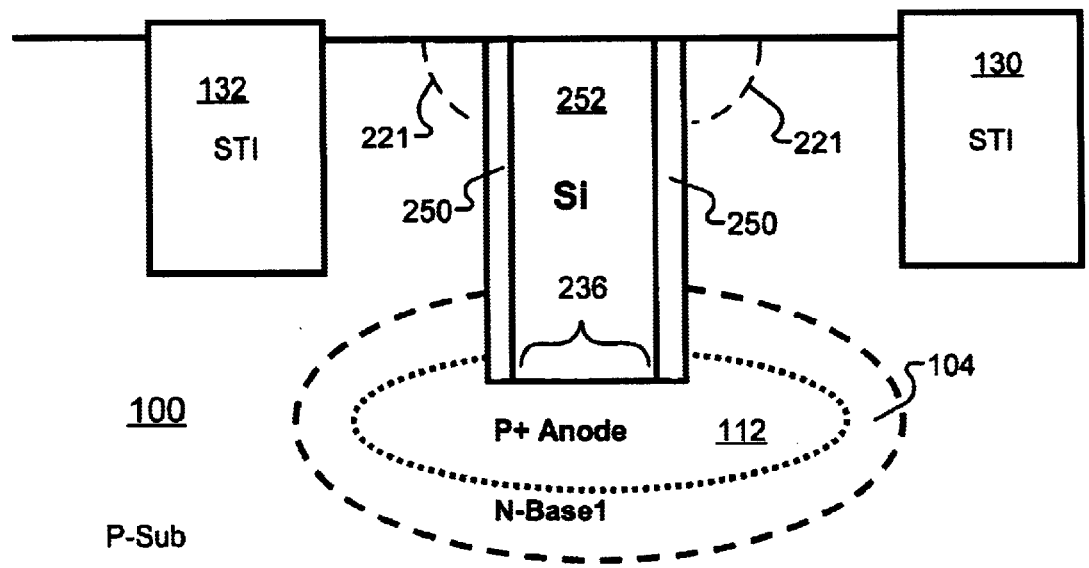
FIG. 2 shows the thyristor-based semiconductor device of FIG. 1, undergoing further manufacture, according to another example embodiment of the present invention.

Referring now to FIG. 2, a gate dielectric material 250 is formed on the sidewalls 148 of the trench. In one particular implementation, the sidewalls 148 of the trench are isotropically etched prior to formation of the gate dielectric material 250 to form a recessed area 221 under the nitride layer 120 (shown having been removed), and gate dielectric material is formed in the recessed area. In another particular implementation, dopants in the P+ anode 112 are driven into the substrate to merge the P+ anode 112 with a similar P+ anode of an adjacent thyristor (not shown). After the gate dielectric material 250 is formed, any gate dielectric material at the bottom portion 236 of the trench is anisotropically etched to expose the P+ anode 112 (FIG. 2 shows the gate dielectric material at the bottom of the trench having been removed). The trench is then filled with a silicon pillar 252 that is to be used to form the thyristor body region. In one implementation, the silicon pillar 252 is formed using an amorphous polysilicon deposition followed by a recrystallization step, and in another implementation, using a silicon growth with selective epitaxy.

Figure 3:
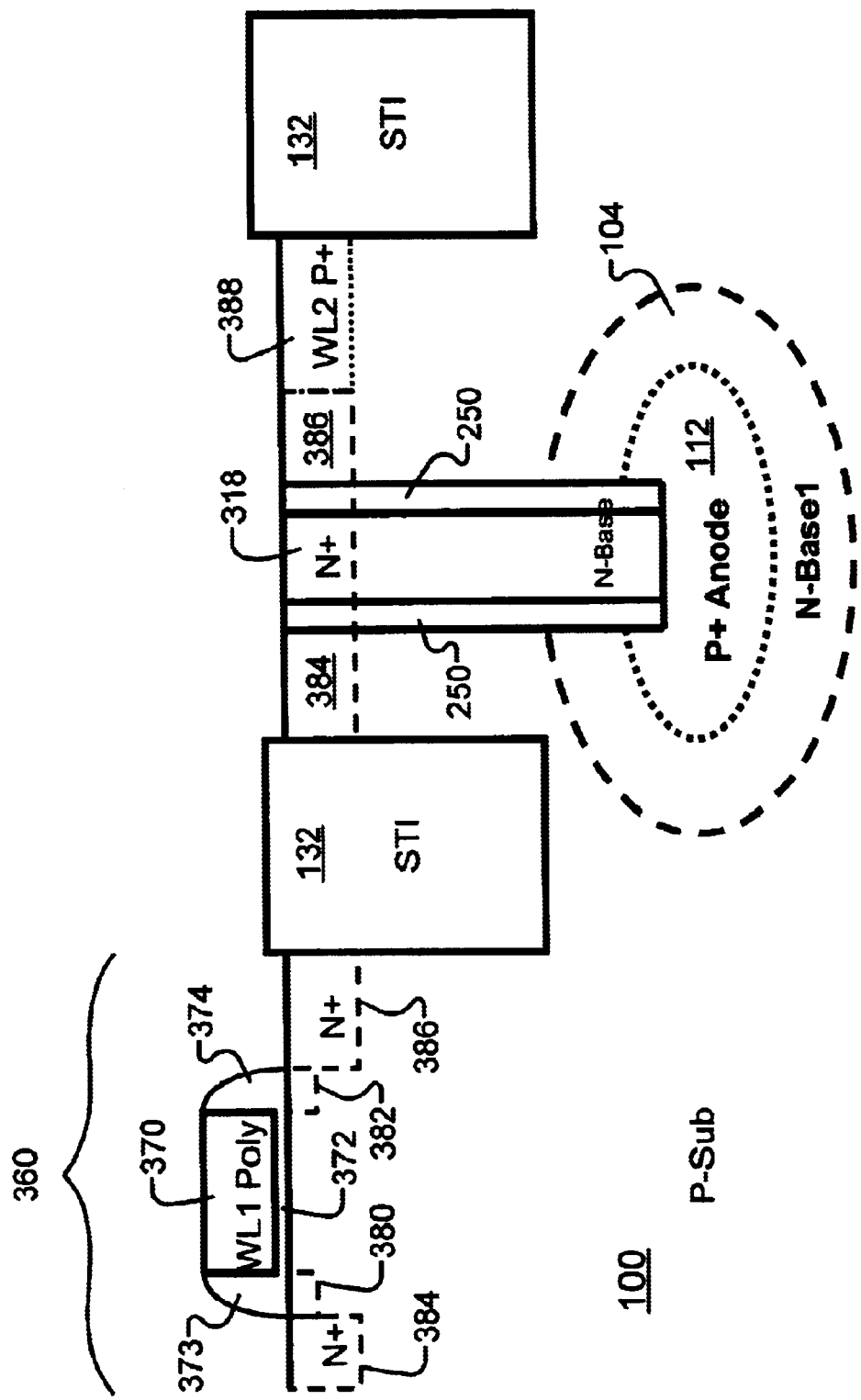
FIG. 3 shows the thyristor-based semiconductor device of FIG. 2, undergoing further manufacture, according to another example embodiment of the present invention.

In FIG. 3, a pass device 360, implemented here as an NMOSFET, is formed adjacent to the STI region 132. First, a gate dielectric material 372 is formed over the substrate 100 and a gate electrode 370 is formed on the gate dielectric material 372. The substrate 100 is doped to form lightly doped N+ regions 380 and 382, using the gate electrode 370 as a mask. Spacers 373 and 374 are then formed on sidewalls of the gate electrode 370, and an N+ implant is carried out to form N+ source/drain regions 384 and 386, as well as N+ cathode emitter region 318 of the thyristor. During the N+ implant, portions 384 and 386 of the substrate 100 are also optionally implanted. A P+ implant is carried out to form a contact 388 to a thyristor control port to be subsequently formed.

Figure 4:
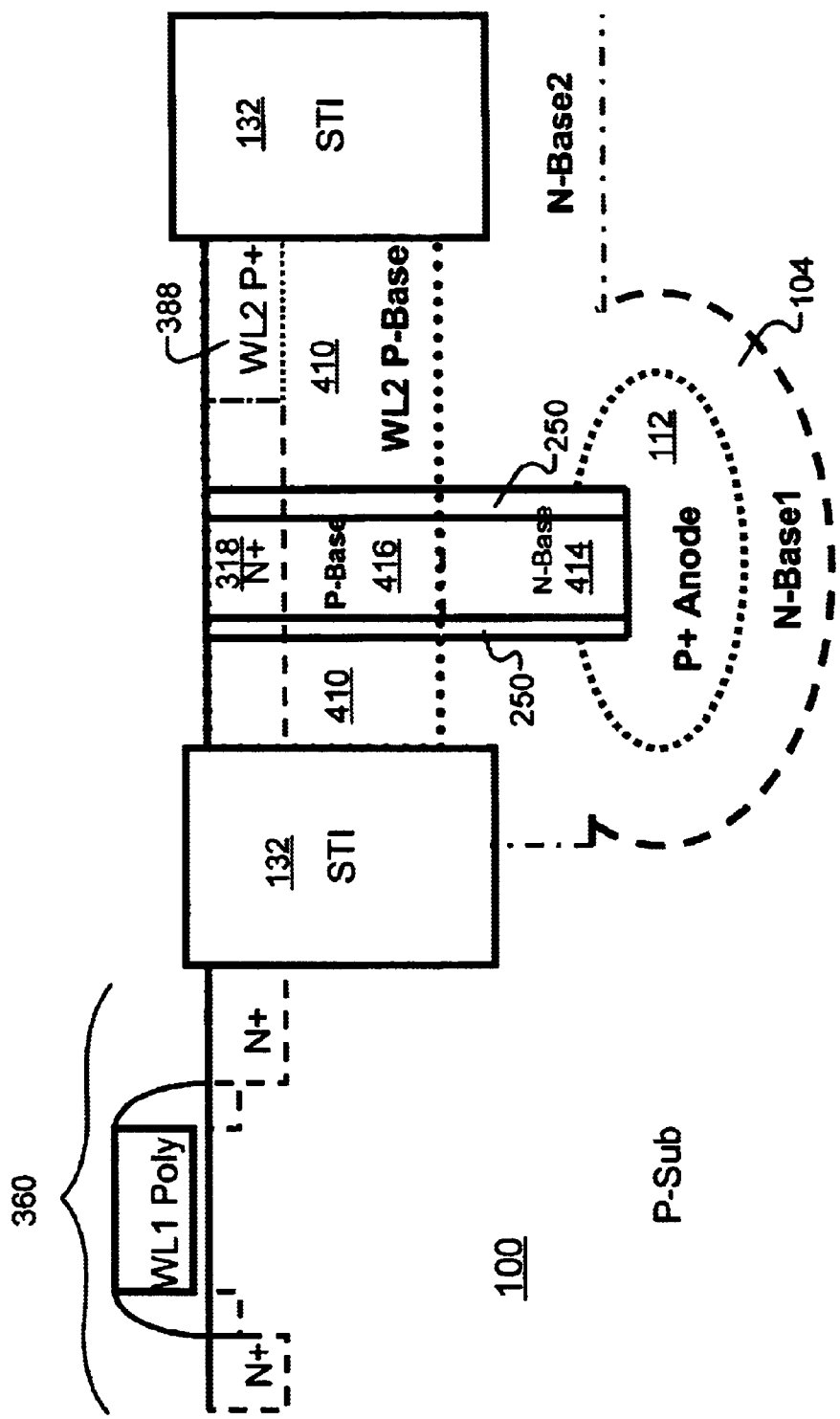
FIG. 4 shows the thyristor-based semiconductor device of FIG. 3, undergoing further manufacture, according to another example embodiment of the present invention.

In FIG. 4, a second N implant is carried out to complete an N base region 414 of the thyristor (e.g., the N well implant to form N well 104 may also form a portion of the N base region 414). A P-type implant is then carried out to form P base region 416 of the thyristor, followed by another P-type implant to form a control port 410 around the P base region. The control port 410 is adapted for capacitively coupling to the P base region 416 for controlling current flow therein. The resulting thyristor includes P+ anode emitter 112, N base region 414, P base region 416 and N+ cathode emitter 318, with the control port 410 adapted to control current flow therein. The width of the P base region 416 and the arrangement thereof in connection with the control port 410 is such that that a signal capacitively coupled to the P base region 410 from the control port 410 controls the resistance state of the thyristor. In one implementation, the P-type implant that forms control port 410 discussed above is skipped, and the P base implant is used to effect both the control port 410 and the P base 416 implants.

In another implementation (not shown), a P+ anode shunt is formed extending from a surface of the substrate 101 to the P+ anode. The P plus anode shunt may, for example, be formed during the P+ anode implant, and is particularly advantageous for bringing a contact up to the surface for electrically coupling a reference voltage to the P+ anode 112. For instance, when an array of such devices are formed, the P+ anodes of each device can be coupled to an adjacent thyristor in the array, such as by driving the implant as discussed above, and a P+ anode shunt is coupled to one of the P+ anodes.

Figure 5:
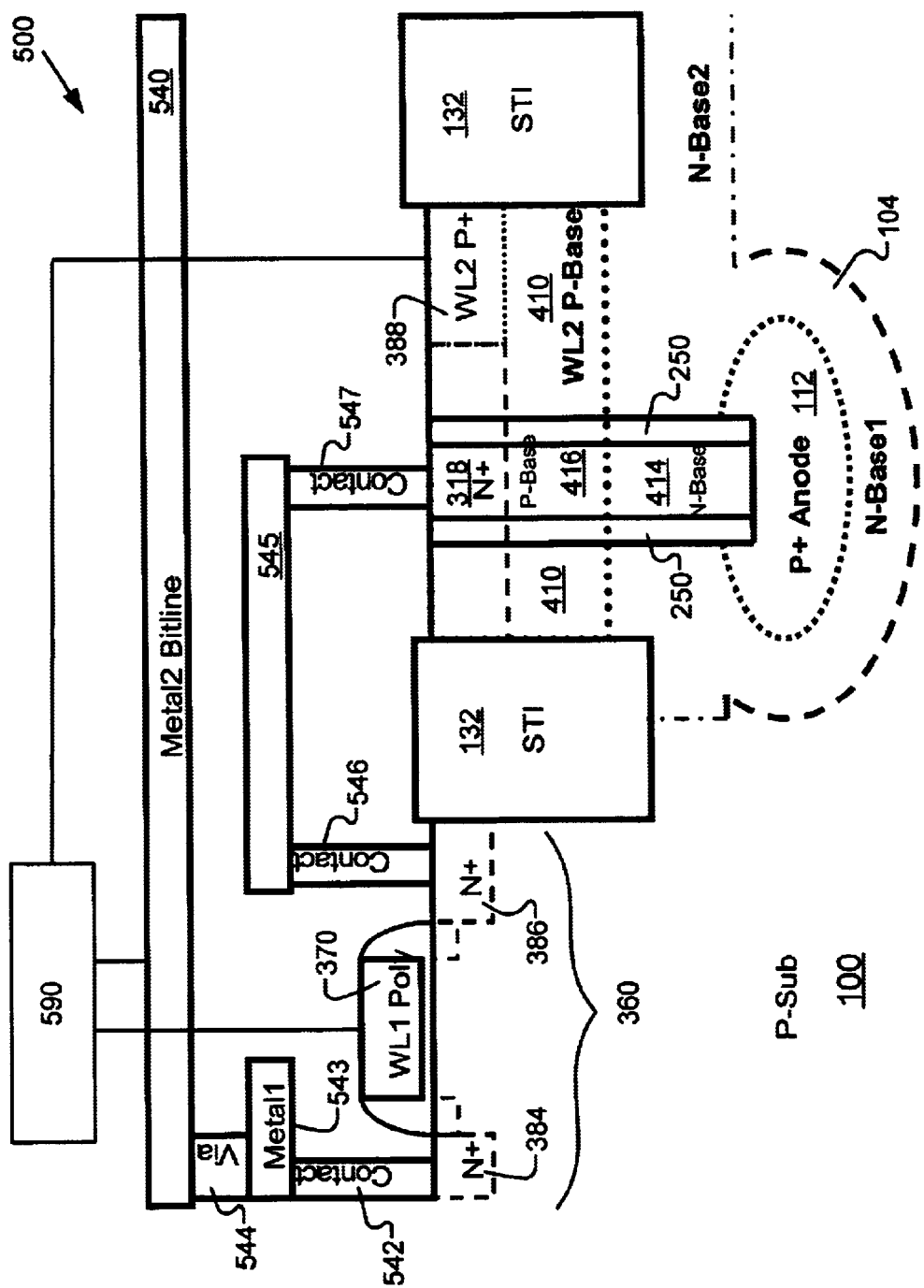
FIG. 5 is a thyristor-based semiconductor device, according to another example embodiment of the present invention.

FIG. 5 shows a thyristor-based semiconductor device 500 manufactured, for example, using steps similar to those outlined in FIGS. 1–4 and coupled to circuitry, according to another example embodiment of the present invention. In this implementation, the N+ cathode emitter 318 is coupled to the N+ source/drain region 386 via contacts 574 and 546 made to a first metal layer portion 545. The N+ source/drain region 384 of the pass device 360 is coupled to a bit line 540 in a second metal layer using contact 542, first metal layer portion 543 and via 544. In response to signals applied to the gate electrode 370 and the control port 410, and with a reference voltage line coupled to the P+ anode emitter 112, the conductance state of the thyristor is controlled for storage and manipulation of data therein. Optionally, salicide is formed on the gate electrode 370 and the control port contact 388.

In another implementation, the transistor 360 is implemented as a PMOSFET, wherein the gate 370 is N doped and the source/drain regions 384 and 386 are P+ doped, and wherein the thyristor is inverted. More specifically, the P base 416 and N base 414 are interchanged, and the N+ emitter 318 and the P+ emitter 112 are interchanged, with the control port 410 being N doped and arranged for capacitively coupling to the N base region 414. With this approach, the booting discussed above is eliminated, which can result in a lower cell read current, which is related to lower drive current exhibited by the PMOSFET.

Generally, as described in the above-mentioned U.S. Patent (U.S. Pat. No. 6,229,161), typical operation of the device 500 involves using an access controller 590 to provide appropriate control over the bit line 540, gate electrode 370 and control port 410 (via P+ contact 388). For example, in standby mode, the bit line 540 and word lines (e.g., which control port 410 and gate electrode 370 form part of) are inactive or at their low voltage levels (which can be different for each line). For a write "Zero" operation, bit line 540 is raised to its high level and gate electrode 370 becomes active. This charges the level at the N+ cathode 318 (used as a storage node) to a high voltage level and moves the thyristor out of the strong forward biased region. A pulse is then applied to control port 410. Capacitive coupling from the control port 410 to the adjacent P base region 416 of the thyristor results in an outflow of the minority charges from the middle P-doped region on the falling edge of the pulse applied to the control port 410 and blocks current passing in the thyristor. The thyristor is sufficiently thin so that the control port 410 has tight control on the potential across the body of the thyristor (e.g., across the P base region 416), and can modulate this potential via the capacitive coupling. The thyristor is switched to the blocking state after this operation.

For a write "One" operation, the voltage level of the bit line 540 is held low. After the gate electrode 370 is raised to its high level, a pulse is applied to the control port 410. The rising edge of this pulse raises the potential of the P base region 416 via capacitive coupling and makes the PN and lower NP junctions forward biased which, in-turn, starts the well-known regenerative process in the PNPN thyristor construction and the thyristor transitions to its forward conducting state. After completing such an operation, control over the bit line 540 and word lines coupled to gate electrode 370 and control port 410 typically changes to effect the standby mode in which a current path through the MOSFET 360 is blocked.

Figure 6:
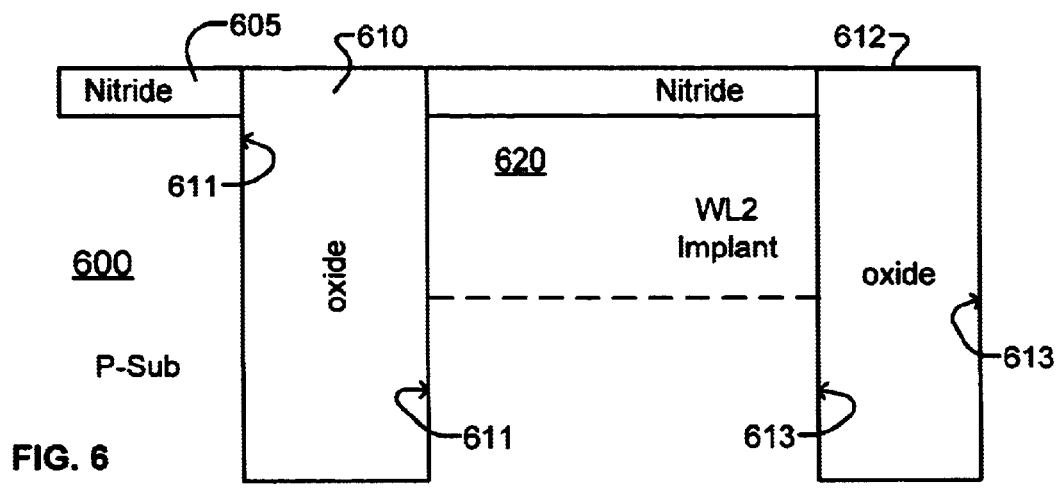
FIG. 6 is a thyristor-based semiconductor device undergoing manufacture, according to another example embodiment of the present invention.

FIGS. 6–10 show a thyristor-based semiconductor device undergoing manufacture, according to another example embodiment of the present invention. Beginning with FIG. 6, a portion of a P-substrate 600 is implanted to form an N-WL2 region 620. In an alternate implementation, the N-WL2 implant is performed at a later step as discussed below. A nitride layer 605 is deposited over the substrate 600, masked and etched to expose the substrate 600 where a deep trench is to be formed (FIG. 6 shows the nitride having already been etched, with the trench etched and filled with oxide). Trenches are etched at the exposed substrate having sidewalls 611 and 613, and oxide is filled in the trenches to form deep trench oxide regions 610 and 612. The deep trench oxide regions are useful, for example, for logic isolation and/or combined with STI. In one implementation, the device is planarized following the trench oxide deposition.

Figure 7:
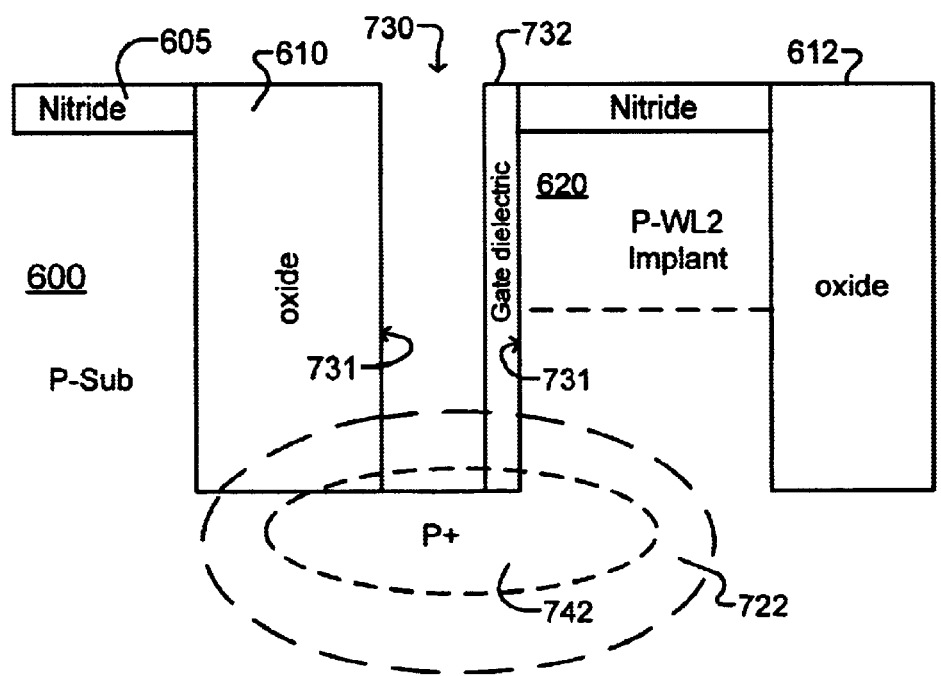
FIG. 7 shows the thyristor-based semiconductor device of FIG. 6, undergoing further manufacture, according to another example embodiment of the present invention.

In FIG. 7, the nitride layer 605 is masked and etched to expose a portion of the substrate 600, and a trench 730 having sidewalls 731 is etched in the substrate where the nitride layer has been removed and is self-aligned to the etched nitride and oxide in the trench. In an alternate implementation (not shown), the nitride layer 605 is stripped and a portion of the oxide trench 610 is selectively etched to form the trench, which may be accomplished using, for example, a mask over a portion of the trench followed by an anisotropic etch. Once the trench 730 is formed, a gate dielectric material 732 is formed on the sidewall 731 of the trench and a portion of the substrate 600 is implanted with N dopant to form N well 722, followed by P+ doping to form an emitter region 742 of an anode end of a thyristor.

In one implementation (not shown), the semiconductor device is used in a memory cell wherein several such trenches are formed with a P+ emitter region at the bottom. In this instance, the trenches are formed sufficiently close such that the P+ regions electrically contact each other. In a more particular implementation (not shown), the P+ implant is driven into the substrate to enhance contact between the P+ regions of adjacent cells. For a top-down view of an array of memory cells that may be implemented in a manner not inconsistent with this approach, reference may be made to FIG. 12, discussed below.

Figure 8:
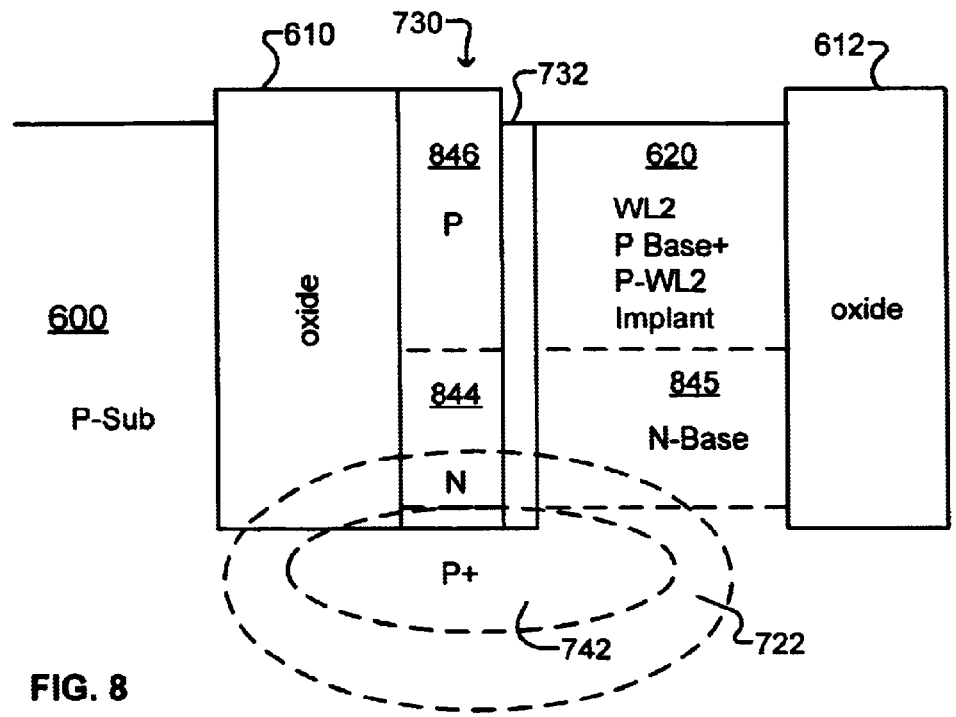
FIG. 8 shows the thyristor-based semiconductor device of FIG. 7, undergoing further manufacture, according to another example embodiment of the present invention.
Figure 9:
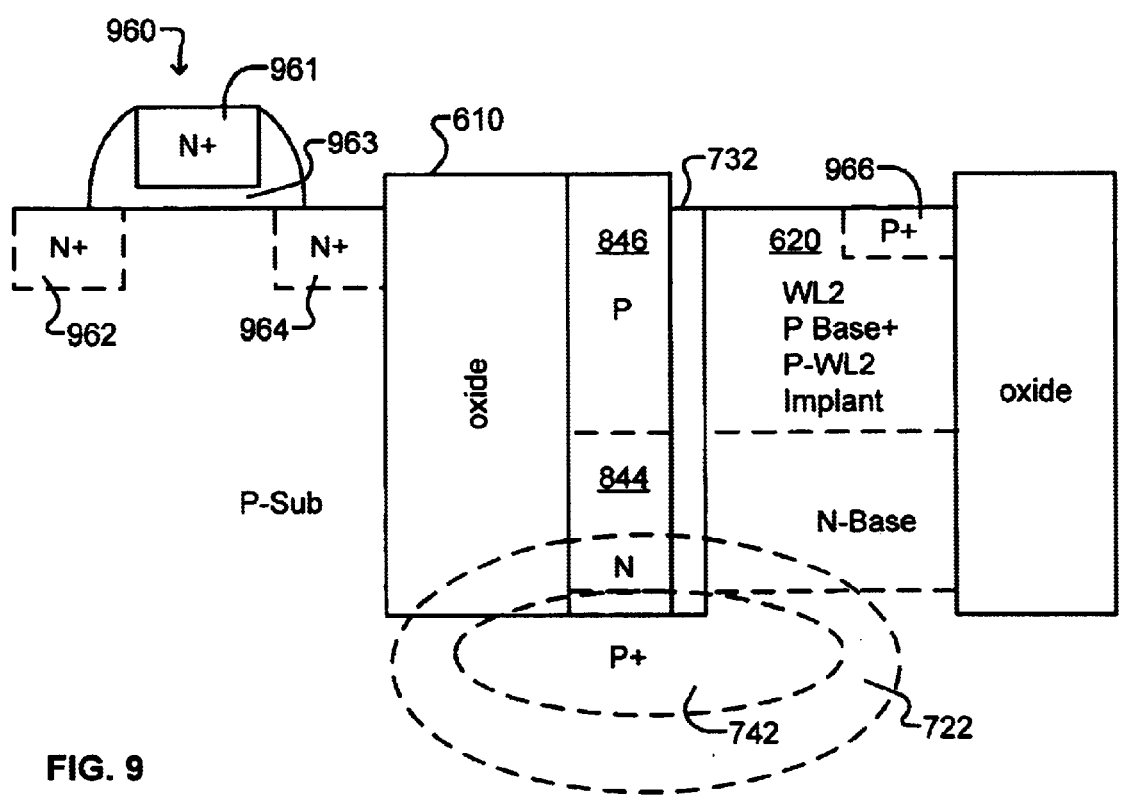
FIG. 9 shows the thyristor-based semiconductor device of FIG. 8, undergoing further manufacture, according to another example embodiment of the present invention.

In FIG. 8, any gate dielectric material formed on the bottom of the trench during sidewall gate dielectric material formation is anisotropically etched to expose the P+ doped region of the substrate. Amorphous polysilicon is deposited in the trench 730, recrystallized and implanted to form N base 844 and P base 846 regions. The N base and P base implant processes also implant regions 845 and 620. The depth of the oxide trench 610 is sufficient to electrically isolate the N base 844 from the substrate 600. As discussed above, the P WL2 implant of FIG. 6 may be optionally skipped, wherein the P base implant is used in its place. A pass gate (transistor) 960 is formed in FIG. 9 having gate 961 formed over a gate dielectric material 963 and source/drain regions 962 and 964. A P+ region 966 is also implanted in the P WL2 region 620.

Figure 10A:
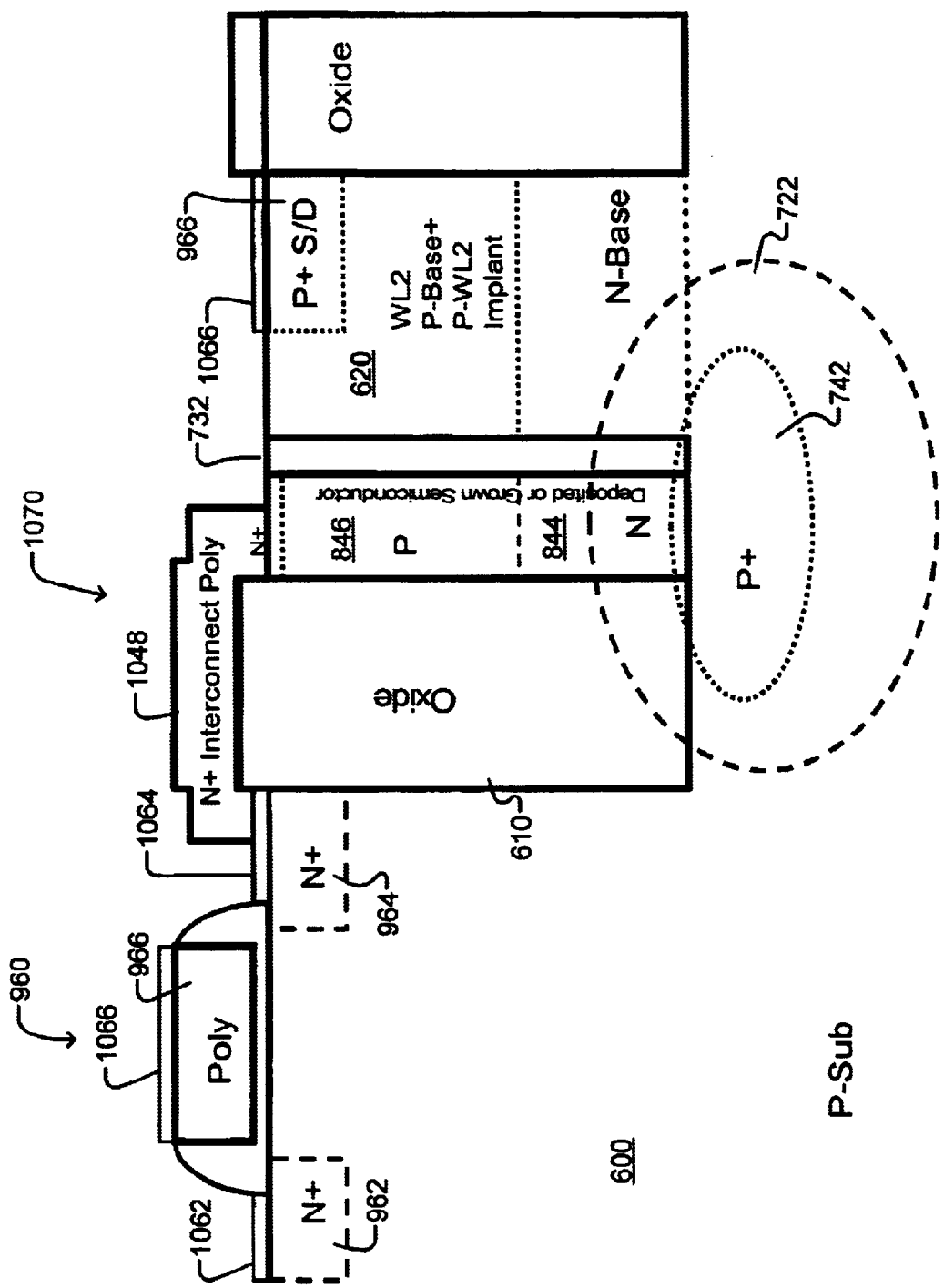
FIG. 10A shows the thyristor-based semiconductor device of FIG. 9, undergoing further manufacture, according to another example embodiment of the present invention.

In FIG. 10A, salicide portions 1066, 1062 and 1064 are respectively formed over the N+ region 966, source/drain region 962 and source/drain region 964. Polysilicon 1048 is deposited over the P base region 846, the oxide trench 610 and the salicide 1064. The deposited polysilicon 1048 is doped to an N+ polarity and couples the P base 846 with the N+ source/drain region 964 of the pass gate 960 via salicide 1064, thus forming an N+ emitter region. The salicide shorts the N+ polysilicon 1048 with the N+ source/drain region 964. In another process (not shown) the salicide is done after the polysilicon interconnect is formed. The resulting device includes a thyristor 1070 having P+ emitter 742 and N base 844 of an anode end portion, P base 846 and N+ emitter 1048 of a cathode end portion, and control port region (P-WL2) 620. The control port region 620 is adapted to capacitively couple to the P base of the thyristor via the gate dielectric material 732 for controlling states (e.g., current blocking/passing, high/low resistance) of the thyristor 1070. The thyristor 1070 is coupled to the pass gate 960 and can be used in a variety of implementations, including memory cells and others. Further electrical connections (not shown) may include, for example, a bit line connection to the source/drain region 962 and word line connections to gates 966 and 620.

Figure 10B:
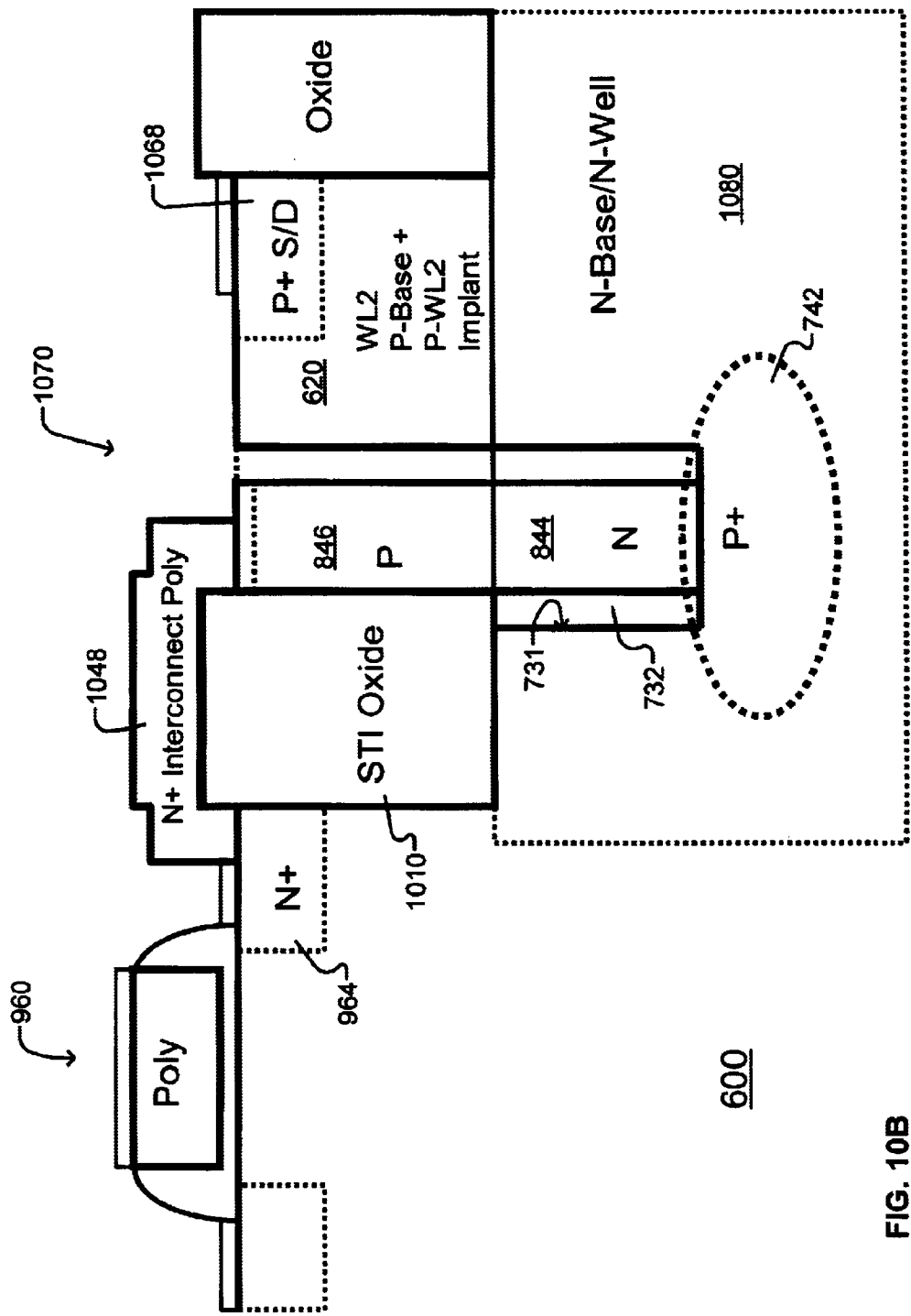
FIG. 10B shows the thyristor-based semiconductor device of FIG. 9, undergoing further manufacture, according to another example embodiment of the present invention.

FIG. 10B is another example embodiment of the present invention, similar to FIG. 10A but wherein the deep oxide trench 610 is replaced with STI oxide 1010 formed deep enough to isolate the P base region 846. Gate dielectric material 732 is also formed at the sidewall where the STI 1010 is not present (below the STI 1010 and around the N base region 844). A deep N base region 1080 is formed in P substrate 600, and the P+ emitter region 742 is formed in the N well region 1080 at the bottom of a trench.

Various implementations of the above example embodiments can be used to form thyristor-based semiconductor devices having a variety of arrangements, as discussed further below.

Figure 11:
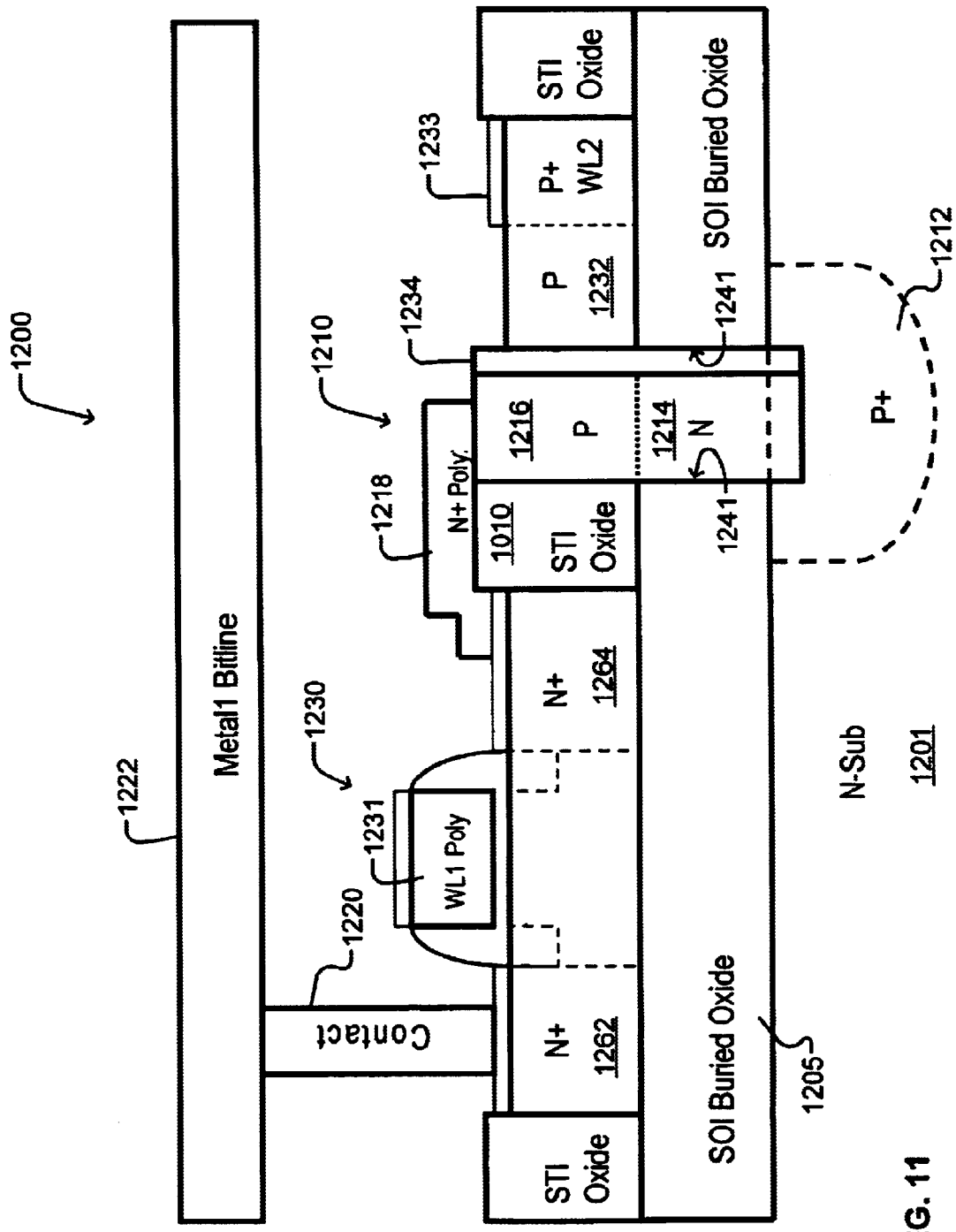
FIG. 11 is a thyristor-based semiconductor device, according to another example embodiment of the present invention.

FIG. 11 shows a thyristor-based device 1200 formed in a silicon on insulator (SOI) arrangement having a buried insulator 1205, according to another example embodiment of the present invention. The device 1200 includes a thyristor 1210 coupled to a pass gate 1230 that has a bit line contact 1220 to a source/drain region 1262 of the pass gate. The thyristor 1210 is formed anode-side down, similar to the thyristor shown in FIG. 10B. In this instance, however, the STI 1010 is formed extending to the buried insulator layer 1205, and a trench formed for the thyristor extends through the buried insulator layer and has sidewalls 1241. A portion of N substrate 1201 is doped to P+ polarity to form an emitter 1212 of an anode end of the thyristor 1210. N base region 1214, P base region 1216 and N+ emitter 1218 (coupled to N+ source/drain region 1264 of the pass device 1230) make up the rest of the thyristor body, and P region 1232 acts as a gate for the thyristor and is capacitively coupled to the P base 1216 via a gate dielectric material 1234.

In a more particular implementation (not shown), the approaches discussed above are implemented in forming one or more vertical MOSFET devices. For instance, referring to FIG. 11 as an example, the thyristor 1210 is modified to form a MOSFET by removing one of the base regions and using the other gated base region as a channel region of a MOSFET. For instance, the N base region 1214 can be replaced by expanding the P base region 1216 into the same region, with N+ emitter region 1218 and P+ emitter region 1212 effectively being source/drain for the MOSFET.

Figure 12:
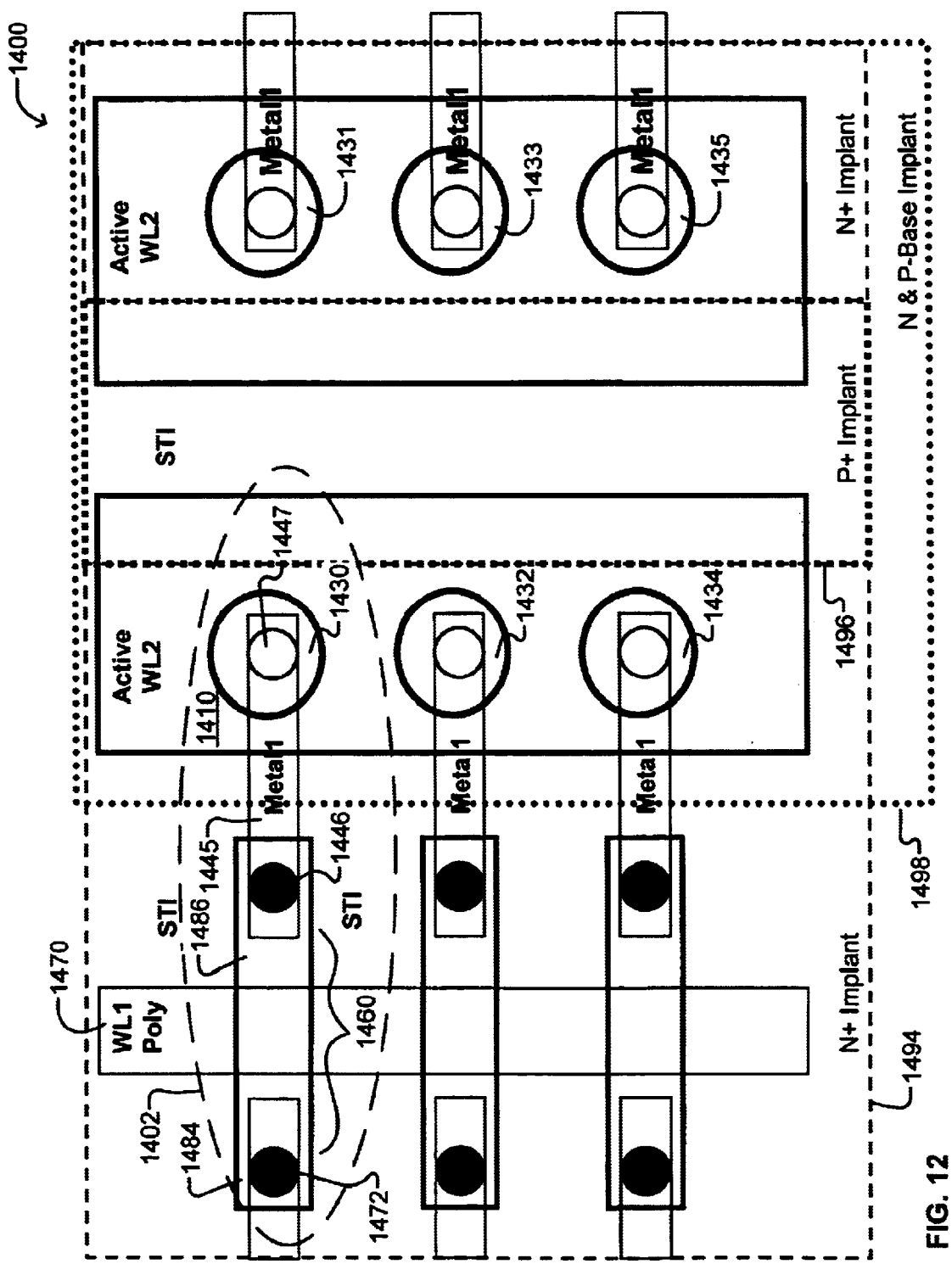
FIG. 12 is a memory array including thyristor-based semiconductor devices, such as those described herein, according to another example embodiment of the present invention.

The methods and devices described herein are applicable to a variety of structures and arrangements. FIG. 12 shows one such arrangement from a top-down view, wherein several thyristor-based elements are formed in a memory array 1400, according to another example embodiment of the present invention. The memory array 1400 may include, for example, thyristor-based devices such as those described hereinabove. The memory array 1400 includes several thyristors 1430–1435 with pass gates coupled to each thyristor. The thyristors 1430–1435 are formed close enough so that anodes at the bottom of the thyristors merge with one another.

Referring to memory cell 1402 in FIG. 12 as another example, an upper N+ emitter region of the thyristor 1430 is coupled via a contact 1447 to a portion 1445 of a first metal layer, and to a first N+ source/drain region 1486 of a pass device 1460 via an contact 1446. The pass device 1460 further includes a second N+ source/drain region 1484 and a gate that is part of a first word line 1470. A bit line contact 1472 is coupled to the second N+ source/drain region 1484. A control port 1410 is adapted for capacitively coupling to the thyristor 1430 for controlling a resistance state thereof. Various example implant regions, including N+ implant region 1494, P+ implant region 1496 and N and P base implant regions 1498 are shown as dashed lines and may, for example, be used in connection with the processes discussed hereinabove.

In one implementation, one or more of the thyristors in the array 1400 are formed as a trapezoid pillar, or "T" shaped with a portion of a base region therein to which capacitive coupling is primarily made being located at a wider portion of the trapezoid or "T" shape, relative to the other base region. This trapezoid or "T" approach is particularly useful for increasing coupling area between the control port 1412 and the thyristor. In still another implementation, an extra pillar is formed adjacent an end thyristor having a P+ anode contact to contact the anodes, as discussed above.

The various example embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. An example of such a change would be to modify a junction between two of the adjacent thyristor regions such as a thin depletion region as described in U.S. Patent Document entitled Stability in Thyristor-Based Memory Device, Ser. No. 09/814,980, and filed Mar. 22, 2001. Other changes may include but are not necessarily limited to: altering the shapes, locations, and sizes of the illustrated thyristors and shunts; adding structures to the integrated circuit device; increasing the number of PN body sections in the thyristor; and interchanging P and N regions and/or interchanging PMOSFETS with NMOSFETS. In addition, for general information regarding thyristors including thin capacitively-coupled thyristors, and for particular information regarding implementations to which the present invention is applicable and their respective operations, reference may be made to U.S. Pat. No. 6,229,161, referenced above. Such modifications and changes do not depart from the true spirit and scope of the present invention that is set forth in the following claims.

What is claimed is:

1. A method for making a semiconductor device, the method comprising:

providing a trench in a substrate;

forming a semiconductor material in the trench;

forming a thyristor having adjacent regions of different polarity, at least one of the regions including a portion of the formed semiconductor material in the trench and at least one other of the regions including a portion of the substrate that is adjacent the trench; and forming a control port capacitively coupled to one or more of the adjacent regions;

wherein providing a trench in the substrate comprises:
  etching a trench in the substrate;
  lining the trench with a gate dielectric material;
  implanting a portion of the substrate below the trench; and
  anisotropically etching gate dielectric material from the bottom of the trench.

2. The method of claim 1, wherein lining the trench includes depositing semiconductor material in the trench and wherein forming the thyristor includes doping a portion of the deposited semiconductor material.

3. A method for making a semiconductor device, the method comprising:

providing a trench in a substrate;

forming a semiconductor material in the trench;

forming a thyristor having adjacent regions of different polarity, at least one of the regions including a portion of the formed semiconductor material in the trench and at least one other of the regions including a portion of the substrate that is adjacent the trench; and forming a control port capacitively coupled to one or more of the adjacent regions;

wherein forming the control port comprises implanting a portion of the substrate adjacent the provided trench.

4. The method of claim 3, wherein providing a trench in a substrate includes etching a trench in the substrate, doping a portion of the substrate to N+ doping and using the N+ doped substrate as a cathode emitter of the thyristor.

5. The method of claim 3, wherein providing a trench in a substrate includes etching a trench in the substrate, doping a portion of the substrate to P+ doping and using the P+ doped substrate region as an anode emitter of the thyristor.

6. The method of claim 3, wherein providing a trench in a substrate comprises:
   etching a trench in a substrate; and
   doping a portion of the substrate adjacent the trench and using at least a part of the doped portion as one of the adjacent regions.

7. The method of claim 3, wherein forming the control port includes capacitively coupling the control port to a base region of the thyristor.

8. The method of claim 3, wherein forming the control port includes forming a gate.

9. The method of claim 3, wherein forming the control port includes selectively forming the control port around a selected region of the thyristor.

10. The method of claim 3, wherein forming the thyristor includes forming a thyristor having at least four differently doped sections making up a thyristor body, at least one of the four sections including a portion of the substrate.

11. The method of claim 10, wherein forming the thyristor includes forming three of four sections in the trench.

12. The method of claim 10, wherein forming the thyristor includes forming two of the four sections in the trench.

13. The method of claim 3, further comprising coupling the thyristor to additional circuitry in the semiconductor substrate.

14. The method of claim 3, further comprising coupling the thyristor to a transistor and forming a memory cell comprising the thyristor and the transistor.

15. The method of claim 14, wherein forming the thyristor includes using at least a portion of a source/drain region of the transistor as one of the adjacent regions.

16. The method of claim 15, wherein forming the thyristor includes using the at least a portion of the source/drain region as an emitter region of the thyristor.

17. The method of claim 14, wherein forming the thyristor includes forming a source/drain region of the transistor.

18. The method of claim 3, wherein forming the thyristor includes forming the thyristor during a CMOS fabrication process.

19. The method of claim 3, wherein forming the thyristor includes forming a thin capacitively coupled thyristor.

20. The method of claim 3, further comprising forming a salicide material that electrically connects the thyristor to other circuitry in the semiconductor device.

21. The method of claim 20, wherein forming the salicide material includes electrically connecting the thyristor to a standard CMOS device.

22. A method for making a semiconductor device, the method comprising:
   providing a trench in a substrate;
   forming a semiconductor material in the trench;
   forming a thyristor having adjacent regions of different polarity, at least one of the regions including a portion of the formed semiconductor material in the trench and at least one other of the regions including a portion of the substrate that is adjacent the trench; and
   forming a control port capacitively coupled to one or more of the adjacent regions;
   wherein forming the control port includes forming the control port below a plane defining an upper end of the trench.

23. A method for making a semiconductor device, the method comprising:
   providing a trench in a substrate;
   forming a semiconductor material in the trench;
   forming a thyristor having adjacent regions of different polarity, at least one of the regions including a portion of the formed semiconductor material in the trench and at least one other of the regions including a portion of the substrate that is adjacent the trench; and
   forming a control port capacitively coupled to one or more of the adjacent regions;
   wherein forming the control port includes using a portion of the substrate as at least a part of the control port.

24. A method for making a semiconductor device, the method comprising:
   providing a trench in a substrate;
   forming a semiconductor material in the trench;
   forming a thyristor having adjacent regions of different polarity, at least one of the regions including a portion of the formed semiconductor material in the trench and at least one other of the regions including a portion of the substrate that is adjacent the trench;
   forming a control port capacitively coupled to one or more of the adjacent regions; and
   forming an insulating material in the trench, prior to forming the thyristor.

25. A method for making a semiconductor device, the method comprising:
   providing a trench in a substrate;
   forming a semiconductor material in the trench;
   forming a thyristor having adjacent regions of different polarity, at least one of the regions including a portion of the formed semiconductor material in the trench and at least one other of the regions including a portion of the substrate that is adjacent the trench;
   forming a control port capacitively coupled to one or more of the adjacent regions; and
   forming a dielectric material prior to forming a semiconductor material in the trench, wherein forming a control port includes forming the control port adjacent to the dielectric material, the control port being configured and arranged to capacitively couple to the thyristor via the dielectric material.

26. A method for making a semiconductor device, the method comprising:
   providing a trench in a substrate;
   forming a semiconductor material in the trench;
   forming a thyristor having adjacent regions of different polarity, at least one of the regions including a portion of the formed semiconductor material in the trench and at least one other of the regions including a portion of the substrate that is adjacent the trench;
   forming a control port capacitively coupled to one or more of the adjacent regions; and
   etching an isolation trench in the substrate and filling the trench with an insulator material.

27. The method of claim 26, wherein the isolation trench is etched prior to providing the trench in the substrate.

28. The method of claim 26, wherein etching the isolation trench includes etching a trench deep enough to isolate at least one of the thyristor regions formed from a portion of the formed semiconductor material.

29. A method for making a semiconductor device, the method comprising:
   providing a trench in a substrate;
   forming a semiconductor material in the trench;

forming a thyristor having adjacent regions of different polarity, at least one of the regions including a portion of the formed semiconductor material in the trench and at least one other of the regions including a portion of the substrate that is adjacent the trench;

forming a control port capacitively coupled to one or more of the adjacent regions; and recessing sidewalls of the trench and forming a gate dielectric material in the recessed sidewall.

30. A method for making a semiconductor device, the method comprising:

providing a trench in a substrate;

forming a semiconductor material in the trench;

forming a thyristor having adjacent regions of different polarity, at least one of the regions including a portion of the formed semiconductor material in the trench and at least one other of the regions including a portion of the substrate that is adjacent the trench; and forming a control port capacitively coupled to one or more of the adjacent regions;

wherein forming the thyristor includes doping the portion of the substrate contiguously adjacent the trench and driving the dopant into the substrate.

\* \* \* \* \*